US006332027B1

(12) United States Patent
Guilloud et al.

(10) Patent No.: US 6,332,027 B1
(45) Date of Patent: Dec. 18, 2001

(54) NOISE-ABSORPTION STRUCTURES AND WALLS CONSTITUTED THEREBY

(75) Inventors: Jean-Claude Guilloud, Plaisir; Dominique Collin, Draveil; Jacques Julliard, Hericy; Christine Fumoux, Villiers Saint Frederic, all of (FR)

(73) Assignees: Bertin & Cie, Plaisir Cedex; Societe Nationale d'Etude et de Construction de moteurs d'Aviation - Snecma, Paris Cedex, both of (FR)

( * ) Notice: Subject to any disclaimer, the term of this patent is extended or adjusted under 35 U.S.C. 154(b) by 0 days.

(21) Appl. No.: 09/003,900

(22) Filed: Jan. 7, 1998

Related U.S. Application Data

(63) Continuation of application No. 08/883,136, filed on Jun. 27, 1997, now abandoned.

(51) Int. Cl.[7] .......... H03B 29/00
(52) U.S. Cl. .......... 381/71.1
(58) Field of Search .......... 381/71.7, 71.4; 181/206, 210; 244/1 N

(56) References Cited

U.S. PATENT DOCUMENTS 5,778,081 * 7/1998 Patrick .......... 381/71.7
6,041,125 * 3/2000 Nishimura et al. .......... 381/71.4

FOREIGN PATENT DOCUMENTS 2 482 663 11/1981 (FR) .
2 715 244 7/1995 (FR) .

* cited by examiner

*Primary Examiner*—Forester W. Isen
*Assistant Examiner*—Brian Tyrone Pendleton
(74) *Attorney, Agent, or Firm*—Alston & Bird LLP

(57) ABSTRACT

A noise-absorption structure comprising a frame over which a gastight membrane is tensioned, the outside face of the membrane receiving soundwaves, a gas such as air filling the volume defined by the frame and the membrane, and energy-dissipation means housed in the volume, which means are of the laminar gas-flow type, of the electrostatic type, or of the electromagnetic type, and area adjustable or controllable to modify the acoustic impedance of the structure as a function of the characteristics of the noise to be absorbed. The invention is particularly applicable in the aviation industry.

8 Claims, 4 Drawing Sheets

NOISE-ABSORPTION STRUCTURES AND WALLS CONSTITUTED THEREBY

This application is a continuation of Ser. No. 08/883,136 filed Jun. 27, 1997, now abandoned.

The invention relates in general to noise-absorption structures and to walls formed by means of these structures, and more particularly to such structures that are lightweight and compact, applicable specifically to the aviation industry for fitting to jet engines, their nacelles, and airplane cabins, in the transportation industry, in the building industry, etc. . . .

BACKGROUND OF THE INVENTION

Proposals have already been made, in French patent application No. 94 00539 (published under No. 2 715 244) for lightweight noise-absorption structures each comprising a support frame on which a gastight membrane is fixed and tensioned, together with plates disposed beneath the membrane to co-operate therewith to form a passive laminar air-flow damper. Soundwaves incident on the side of the membrane remote from said plates give rise to vibratory deformation of the membrane which in turn gives rise to a laminar flow of air between the membrane and the plates, and thus to energy being absorbed. When the acoustic impedance of such a structure is properly matched to the incident soundwaves, a large portion of the energy of said soundwaves is absorbed by the structure over a relatively broad frequency band.

OBJECTS AND SUMMARY OF THE INVENTION

The aim of the present invention is to provide significant improvements to those structures.

An object of the invention is to provide lightweight structures of the above-specified type of acoustic impedance that is modifiable, adjustable, or controllable, and capable of following changes in the sources of noise to be absorbed.

Another object of the invention is to provide lightweight structures of the above-specified type including means for modifying, adjusting, or controlling their acoustic impedances, which means are themselves controllable by a data processing system.

Another object of the invention is to provide walls that are lightweight and thin, made by juxtaposing and assembling such structures.

To this end, the invention provides a noise-absorption structure comprising a support frame over which a gastight membrane is tensioned and fixed, the outside face of the membrane receiving soundwaves, a gas such as air, for example, filling an internal volume defined by the frame and the membrane, and energy-dissipation means housed in said volume, wherein the energy-dissipation means are of the laminar gas-flow type, of the electrostatic type, or of the electromagnetic type, and area modifiable, adjustable, or controllable in order to modify the acoustic impedance of said structure as a function of the characteristics of the noise to be absorbed.

Because their acoustic impedances are modifiable or adjustable, structures of the invention can be designed or adjusted to absorb incident noise or to deflect it by reflection, e.g. as a function of the positions occupied by the structures in a noise-absorption wall or a wall for providing protection against noise.

In a first embodiment, the energy-dissipation means are of the laminar gas-flow type and comprise plates disposed inside the frame a short distance from the membrane, and means for modifying said distance.

In another embodiment, the laminar gas-flow dissipation means comprise at least one gas flow passage or duct connecting a closed chamber defined inside the frame by the membrane to another chamber inside said structure.

For example, the passage may be a duct formed between two superposed plates associated with means for modifying or adjusting the distance between them or for modifying or adjusting the flow section of the duct.

In another embodiment, the laminar gas-flow dissipation means comprise rods carried by the membrane and extending perpendicularly therefrom inside the frame in fixed tubes which are closed at their ends remote from the membrane and which co-operate with the rods to define annular gas-flow channels.

In yet another embodiment, the energy-dissipation means comprise electrode plates disposed parallel to the membrane at a distance therefrom, and at least one other electrode formed on the membrane and connected together with said plates to bias means such as a DC source associated with an electric or electronic circuit including elements for dissipating energy by the Joule effect.

For example, the membrane may include one or more metal-coated zones facing the above-mentioned electrode plates, or it may be made of an electrically-charged plastics material, in which case the bias means are not necessary.

The elements for dissipating energy by the Joule effect comprise, for example, a resistor, advantageously an adjustable resistor, in which case the structure of the invention then includes controlled means for modifying the resistance of the resistor for the purpose of adjusting the acoustic impedance.

In another embodiment, the energy-dissipation means are of the electromagnetic type and comprise electrical conductors moved by the membrane relative to magnetic elements carried by the frame or constituted thereby, the above-mentioned electric conductors comprising, for example, coils connected to the membrane or one or more electric circuits printed or deposited on the membrane.

In a variant, it is possible to use a magnetic membrane that is movable relative to an electric circuit.

According to yet another characteristic of the invention, each above-mentioned structure is closed in gastight manner and contains an expandable and contractible volume element such as a balloon or a bellows, for example, which is filled with air and which is in communication with the outside via a static pressure equalizing orifice, said element occupying a significant fraction of the volume of said structure.

This characteristic makes it possible to compensate for the influences of variations in the external pressure and temperature on the membrane of the noise-absorption structure.

Each structure of the above-specified type is designed to be juxtaposed and assembled with a plurality of other structures of the same type to form a wall that is plane or curved, convex or concave, and in which the structures have acoustic impedances that are similar or different for the purpose of absorbing noise or of deflecting it by reflection, as appropriate.

In such a wall, the energy-dissipation means of at least some of the structures are associated with modification, adjustment, or control means, themselves controllable by a data processor system.

This makes it possible, in particular, to adjust the acoustic impedances of certain portions or of all portions of a wall to take into account a modification or variation over time in the characteristics of the noise to be absorbed.

BRIEF DESCRIPTION OF THE DRAWINGS

The invention will be better understood and other characteristics, details, and advantages thereof will appear more clearly on reading the following description, given by way of example and with reference to the accompanying drawings, in which.

MORE DETAILED DESCRIPTION

Figure 1:
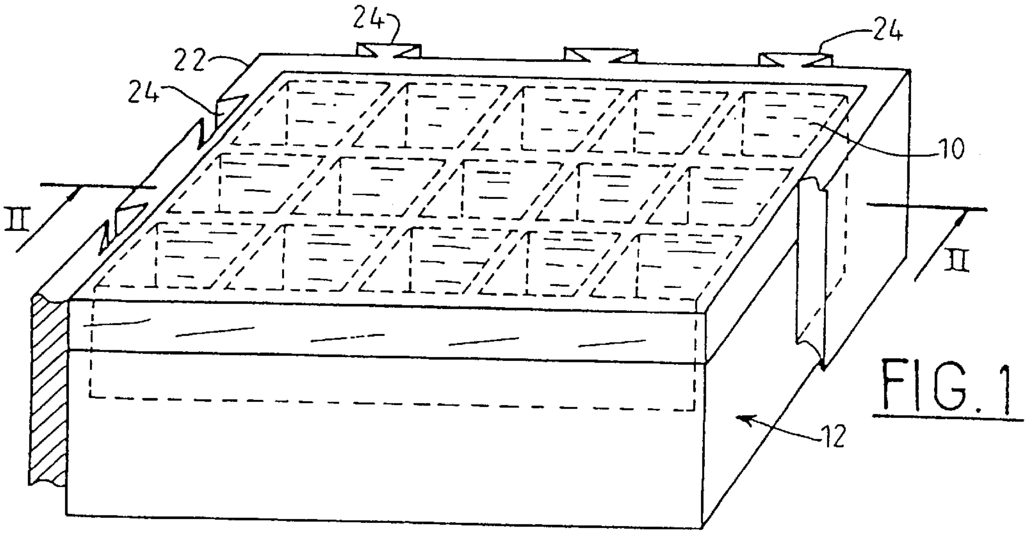
FIG. 1 is a partially cutaway diagrammatic perspective view of a noise-absorption structure of the invention.
Figure 2:
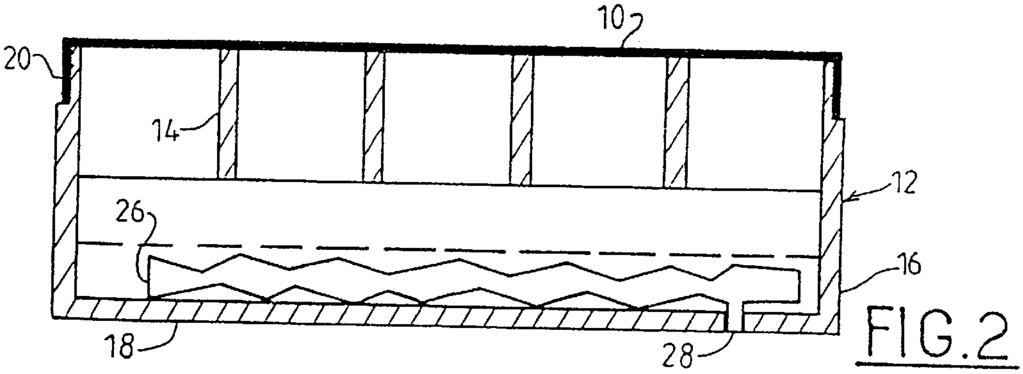
FIG. 2 is a diagrammatic section view on line II—II of FIG. 1.

The noise-absorption structure of the invention, a first embodiment of which is shown by way of example in FIGS. 1 and 2, essentially comprises a fine gastight membrane 10 tensioned over and fixed to the top face of a support frame 12 whose top portion is shaped to have partitions perpendicular to the membrane, and whose bottom portion 16 includes a bottom wall 18 parallel to the membrane.

The membrane 10 can be made, in particular, out of plastics material, elastomer, metal, or any other material enabling a membrane to be made that is sufficiently fine and flexible to be deformable by the soundwaves that are to be absorbed. Since the membrane is fragile, acoustically transparent means (not shown) are provided to cover and protect it from external mechanical damage, which means may be constituted, for example, by a metal cloth associated with a layer of glass wool or the like.

The support frame 12 is made of any suitable rigid material, in particular of metal or of plastics material, depending on the intended application of the structure of the invention.

The membrane 10 can be fixed on the frame 12 by means of its margins 20 folded down over the periphery of the top portion of the frame 12. A surround 22 may be fitted over the periphery of the frame 12 as shown diagrammatically in FIG. 1 for the purpose of enabling structures to be linked to one another, e.g. by assembly or coupling means 24 such as dovetail tongues and grooves.

When the structure of the invention forms a gastight enclosure, the bottom portion of the frame 12 can contain an element 26, as shown diagrammatically in FIG. 2, suitable for contracting and expanding as a function of variations in the static pressure and/or temperature outside the noise-absorption structure of the invention, which element 26 may be constituted by a flexible balloon or a bellows connected to the outside via a passage or orifice 28 for equalizing static pressure, e.g. passing through the bottom wall 18 of the frame 20.

The element 26 occupies a relatively large fraction of the volume defined by the frame 12 and the membrane 10, e.g. about one-third of the volume. When the pressure or the temperature outside the structure increases or decreases, the pressure or the temperature of the gas increases or decreases in corresponding manner inside the element 26 and compensates pressure variations inside the structure, at least in part, thereby making it possible for the membrane 10 to be substantially insensitive to variations in external static pressure and temperature.

In addition, when the inside surface of a fluid flow duct carries structures of the invention or is made of such structures, the elements 26 make it possible to adapt each structure to static pressure changes in the duct.

The membrane 10 can be fixed to the top peripheral portion of the frame 12 by adhesive, as already mentioned, and also to the top edges of the partitions 14 inside the frame 12.

Figure 3:
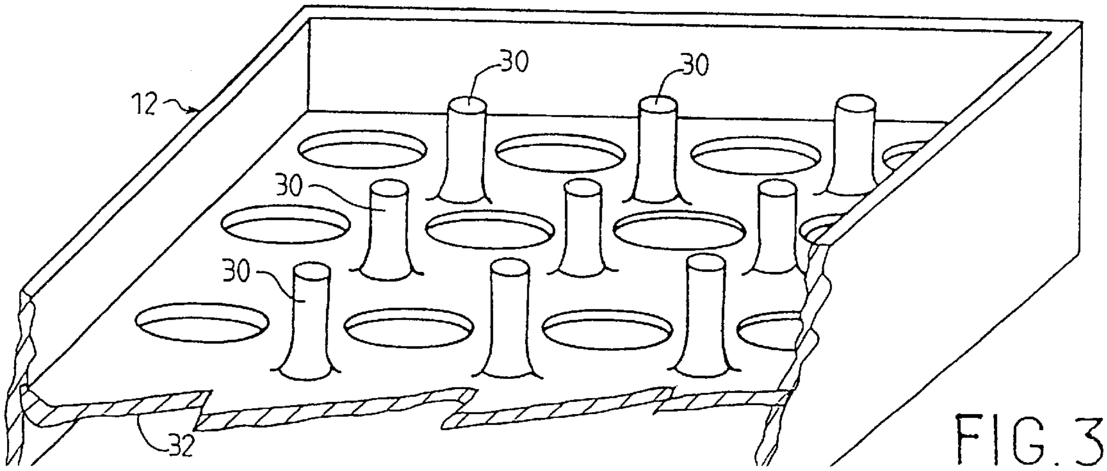
FIG. 3 is a fragmentary diagrammatic perspective view of a variant embodiment.

In a variant, and as shown diagrammatically in FIG. 3, the partitions 14 inside the frame 12 may be replaced by studs 30 perpendicular to the membrane, and the membrane can be fixed to the ends of the studs by adhesive.

The studs 30 may be carried by a perforated plate 32, by a grid, or by any other appropriate means.

The noise-absorption structure of the invention also includes energy-dissipation means, various embodiments of which are shown by way of example in FIGS. 4 to 13.

Figure 4:
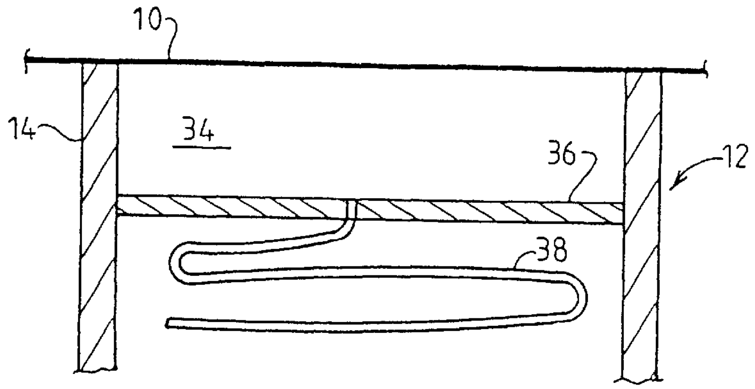
FIGS. 4 to 13 are diagrams showing various ways in which the energy-dissipation means can be embodied.

In FIG. 4, the energy-dissipation means are of the type in which a laminar gas flow (e.g. of air) is produced. The partitions 14 inside the frame 12 co-operate with the membranes 10 to define chambers 34 which are closed by respective bottom walls 36 and which communicate with the bottom volume of the frame 12 via respective ducts 38 of relatively small section and relatively great length compared with their section, enabling energy to be dissipated by a laminar flow of the gas.

Figure 5:
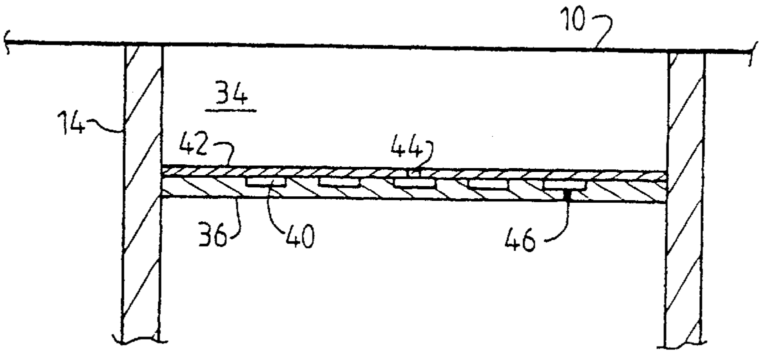

In the embodiment of FIG. 5, the duct 38 is replaced by a channel 40 hollowed out in the top face of the bottom wall 36 and associated with a covering plate 42 which constitutes the top wall of the channel 40. An orifice 44 in the plate 42 connects the chamber 34 to the channel 40, while an orifice 46 in the bottom wall 36 connects the channel 40 to the bottom volume of the frame 12.

Figure 6:
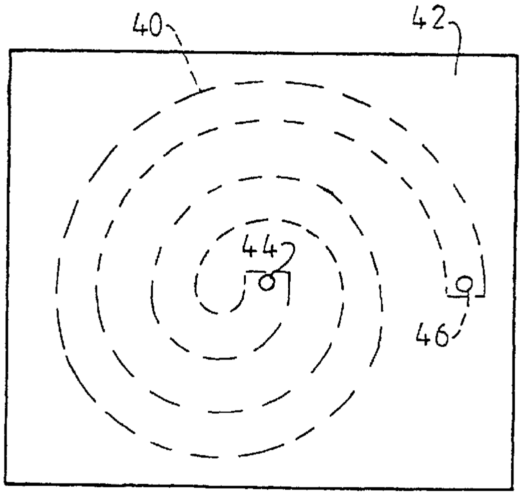
Figure 7:
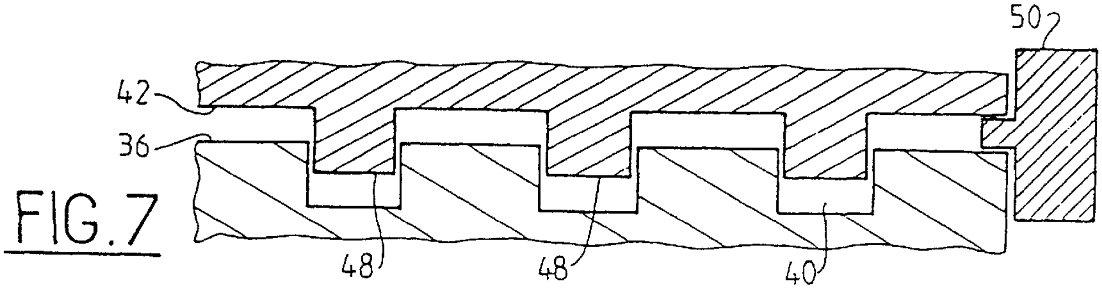

As can be seen better in FIG. 6, which is a plan view of the energy-dissipation means of FIG. 5, the channel 40 can be formed as a spiral in the bottom wall 36 of the chamber 34.

Under the effect of the pressure of incident soundwaves, the membrane 10 deforms and behaves like a largely damped oscillator whose center frequency is a function, inter alia, of the tension of the membrane, of its density, and of its thickness. Deformation of the membrane causes a laminar flow of gas to occur in the energy-dissipation means constituted by the duct 38 or the channel 40.

When the acoustic impedance of a structure of the invention is well matched to the characteristics of the incident noise, then the noise is completely absorbed without being reflected by the membrane.

The invention provides means enabling said acoustic impedance to be modified, adjusted, or controlled.

For example, when the energy-dissipation means comprise a channel 40 of the type shown in FIGS. 5 and 6, acoustic impedance can be modified or adjusted by varying the cross-section of the channel 40. For this purpose, and as shown diagrammatically in FIG. 7, the face of the plate 42 that faces the bottom wall 36 can have projecting a rib 48 formed thereon that is engaged with little clearance in the channel 40 of the plate 36, and means 50 can be provided for modifying the distance between the plate 42 and the bottom wall 36, which means 50 may be of the shape memory type or of the piezoelectric type, for example, and under the control of an appropriate electric circuit.

Modifying the distance between the plate 42 and the wall 36 modifies the cross-section of the channel 40 and thus the conditions of laminar flow for the gas in the channel, thereby modifying the acoustic impedance of the structure of the invention.

When the energy-dissipation means are of the type shown in FIG. 4, the acoustic impedance of the structure can be modified by acting on the volume of the bottom portion of the frame 12 (volume beneath the walls 36), e.g. by using an inflatable element similar to the element 26 of FIG. 2, and connected to pressure adjustment means.

Figure 8:
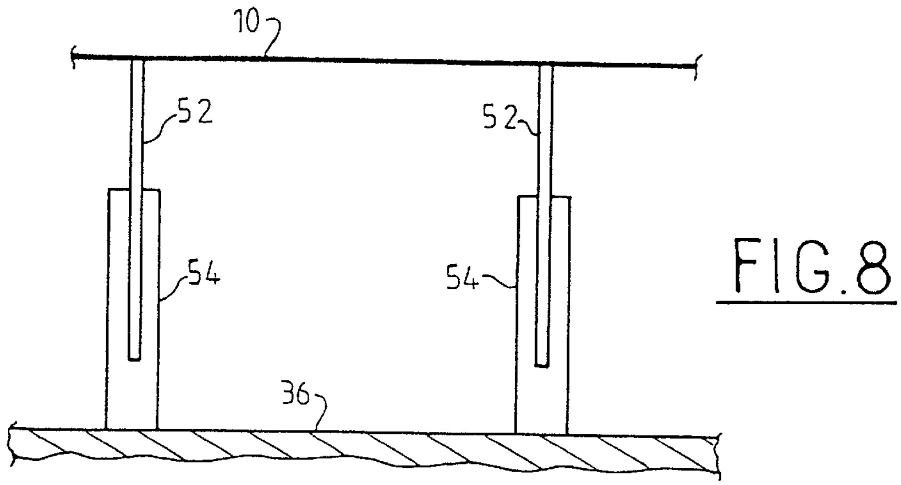

In the variant embodiment of FIG. 8, the membrane 10 carries rods 52 which extend into the support frame perpendicularly to the membrane, and which are engaged in tubes 54 carried by an intermediate wall 36 of the support frame, such that the motion of the rods 52 in the tubes 54 caused by the membrane 10 deforming gives rise to a laminar flow of gas in the tubes 54 and consequently to energy dissipation.

Figure 9:
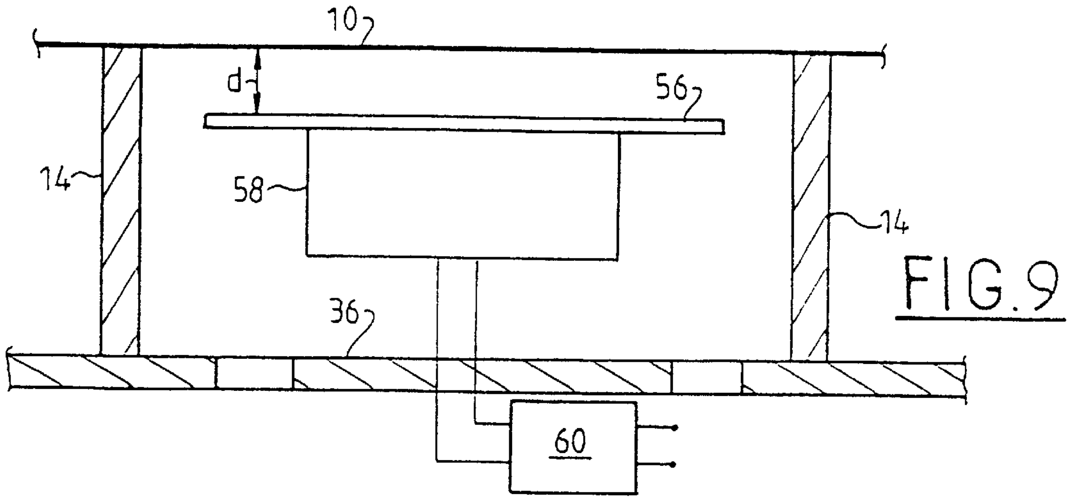

In the embodiment of FIG. 9, the energy-dissipation means are likewise of the laminar gas-flow type and comprise horizontal plates 56 disposed parallel to the membrane 10 and at a short distance therefrom inside the support frame, said plates 56 being carried by means 58 that enable the distance d between the membrane 10 and the plates 56 to be modified. By way of example, the means 58 may be carried by the intermediate wall 36 and may comprise shape memory means controlled by an appropriate electric circuit 60.

Modifying the distance d between a plate 56 and the membrane 10 modifies the acoustic impedance of the structure of the invention.

Figure 10:
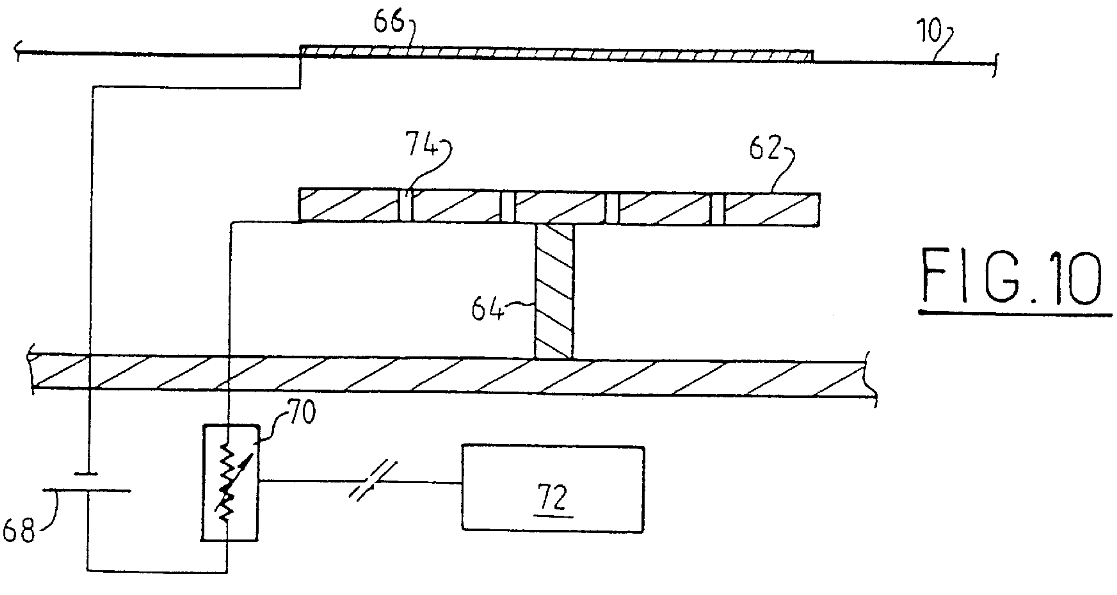

In the embodiment of FIG. 10, the energy-dissipation means comprise electrode plates 62 disposed inside the support frame, parallel to the membrane 10 and a short distance therefrom, e.g. being carried by the intermediate wall 36 of the support frame via dielectric elements 64. The membrane 10 includes electrodes associated with the plates 62, such as metal-coated zones 66 of its surface, for example, with the zones 66 and the plates 62 being connected to opposite poles of a DC source 68 via an energy-dissipation element such as a resistor 70 which is advantageously a variable resistor controlled by appropriate means 72, the resistor 70 absorbing energy by the Joule effect, and variation in its resistance serving to modify the acoustic impedance of the structure of the invention.

Holes 74 are preferably formed through the electrode plates 62 to avoid any laminar gas flow between themselves and the membrane 10.

The electrostatic attraction exerted by the plates 62 on the membrane acts as dynamic anti-stiffening means opposing the stiffness of the gas contained in the structure. This makes it possible to reduce the total thickness (or height) of the structure, and thus make it more compact.

In a variant, the membrane 10 and/or the electrode plates 62 may be constituted by an electret, such as a plastics material of the polyurethane or PVDF type having a permanent electric charge, for example, in which case the electrode bias means are omitted.

Figure 11:
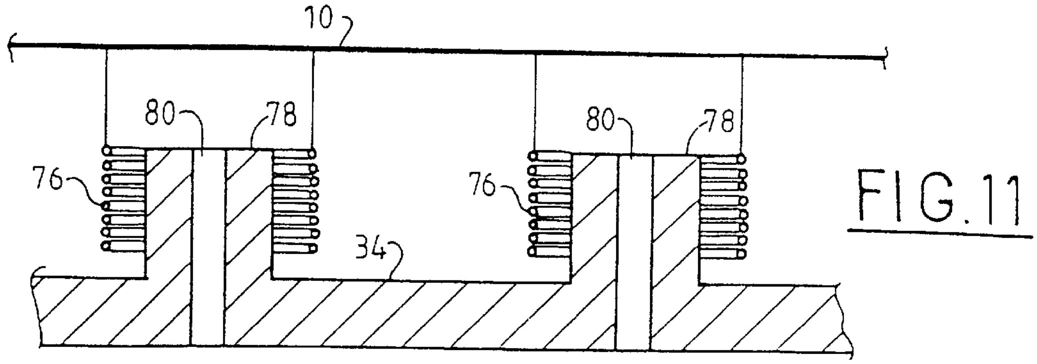

In the embodiment of FIG. 11, the energy-dissipation means are of the electromagnetic type. Inside the frame, the membrane 10 is connected to electric coils 76 that are movable relative to magnetic elements 78, e.g. constituting the intermediate wall 36 of the support frame. To avoid any laminar gas-flow effect, the portions 78 that project towards the membrane may be pierced by through holes 80.

Figure 12:
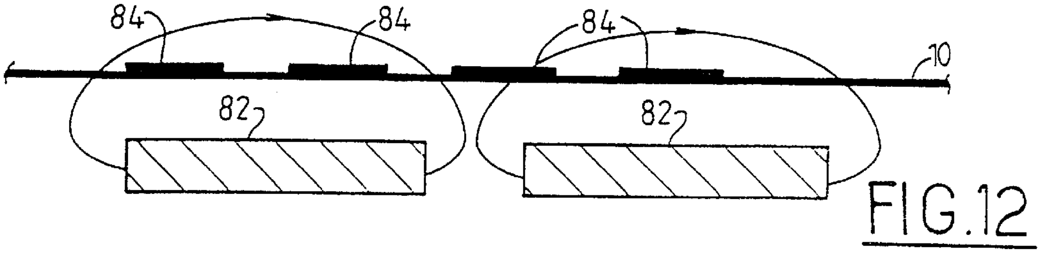

In the embodiment of FIG. 12, magnetic elements 82 (e.g. permanent magnets) are disposed beneath the membrane 10, and electric conductors 84 are carried by the membrane, being constituted by one or more electric circuits printed or deposited on the membrane, for example. Movement of the electric conductors 84 through the magnetic field lines of the elements 80 gives rise to energy dissipation.

Figure 13:
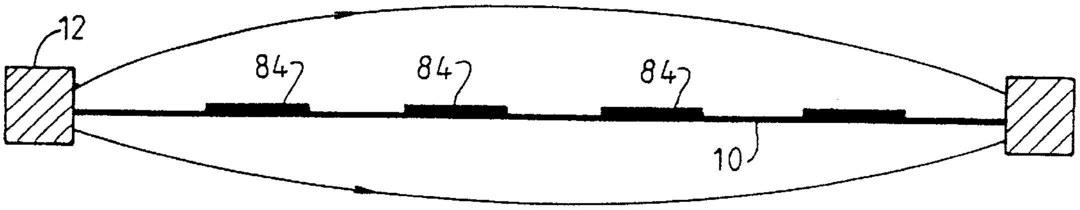

In the variant of FIG. 13, it is a portion of the support frame 12 that can be made of plastics material which constitutes a permanent magnet whose field lines can be crossed by the electric conductors 84 of the membrane 10 to obtain an energy-dissipation effect.

In another variant, a magnetic membrane is used which moves relative to an electric circuit to dissipate energy.

The unit noise-absorption structures as described above can be assembled to one another to form walls that are plane or curved, concave or convex, and of large dimensions. For example, the unit structures of FIGS. 4, 5, 8, and 9 may have surface dimensions of about 5 cm×5 cm and they may be associated with one another to form a structure of the type shown in FIG. 1 having a surface of the order of 20 cm×20 cm, with the heights of the structures generally lying in the range 15 mm to 50 mm. The acoustic impedances of the unit structures can be adjusted individually or in small groups of structures. By adjusting the acoustic impedances, it is possible to obtain a wall in which certain surface zones have acoustic impedance which is well matched, giving rise to maximum absorption of the incident noise, while other surface zones of the wall can have different impedances in order to absorb part of the incident noise and reflect part of it in a given direction.

Also, the possibility of adjusting the acoustic impedance of each unit structure makes it possible to obtain a wall whose acoustic characteristics vary with position. It is also possible to obtain a wall having non-localized acoustic impedance when the bottom portions of the unit structures are interconnected, the acoustic impedance of the linking means constituting a parameter for adjusting the sound frequency bands to be processed. Also, as mentioned above, structures of the invention of the kind shown in FIG. 2 adapt automatically to variations in external static pressure, and for example to variations of the static pressure inside a duct.

What is claimed is:

1. A noise absorption structure comprising a support frame, a gastight, sound-deformable membrane tensioned and fixed over said support frame, said membrane having an outside face receiving soundwaves, an internal volume defined by the frame and the membrane and filled with gas, and electrostatic energy-dissipation means housed in said internal volume for absorbing energy corresponding to membrane deformation caused by incident soundwaves, said energy-dissipation means comprising electrode plates disposed parallel to the membrane at a distance therefrom, at least one other electrode formed on the membrane, and a resistor connected with said electrode plates and with said at least one other electrode, said noise-absorption structure having an acoustic impedance which is modifiable by said energy-dissipation means.

2. A noise absorption apparatus comprising a plurality of the structures according to claim 1, which are juxtaposed and assembled adjacent one another to form a wall that is plane or curved, in which the structures have acoustic impedances that are similar or different for absorbing the incident noise or for deflecting it by reflection.

3. A wall according to claim 2, wherein the energy-dissipation means of at least some of said structures are associated with modification, or control means themselves controllable by a data processor system, and are adaptable to the noise that is to be absorbed and to variation thereof.

4. A structure according to claim 1, including means for adjusting the resistance of the resistor.

5. A structure according to claim 1, wherein the membrane includes at least one metal-coated zone facing said electrode plates.

6. A structure according to claim 1, wherein said electrode and/or the plates are permanently electrically charged.

7. A noise absorption structure comprising a support frame, a gastight, sound-deformable membrane tensioned and fixed over said support frame, said membrane having an outside face receiving soundwaves, an internal volume defined by the frame and the membrane and filled with gas, and electrostatic energy-dissipation means housed in said internal volume for absorbing energy corresponding to membrane deformation caused by incident soundwaves, said electrostatic energy-dissipation means comprising electrode plates disposed parallel to the membrane at a distance therefrom, at least one other electrode formed on the membrane, a resistor, and a direct current source having opposite poles connected respectively with said electrode plates and with said at least one other electrode through said resistor.

8. A structure according to claim 1, wherein said electrode plates and said at least one other electrode are permanently electrostatically charged by opposite poles of a direct current source.

* * * * *

UNITED STATES PATENT AND TRADEMARK OFFICE

CERTIFICATE OF CORRECTION

PATENT NO. : 6,332,027 B1
DATED : December 18, 2001
INVENTOR(S) : Guilloud et al.

It is certified that error appears in the above-identified patent and that said Letters Patent is hereby corrected as shown below:

Title page,
Item [73], Assignees:
Line 3, "de moteurs" should read -- de Moteurs --;
Line 3, "Snecma" should read -- "SNECMA" --.

Item [30], insert the following:
-- [30] Foreign Application Priority Data
June 28, 1996 (FR) 96 08064 --.

Signed and Sealed this

Twentieth Day of August, 2002

*Attest:*

JAMES E. ROGAN

*Attesting Officer*

*Director of the United States Patent and Trademark Office*